(12) United States Patent
Tokuhiro

(10) Patent No.: US 6,847,692 B2
(45) Date of Patent: Jan. 25, 2005

(54) DATA TRANSMISSION SYSTEM

(75) Inventor: Noriyuki Tokuhiro, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/208,707

(22) Filed: Jul. 29, 2002

(65) Prior Publication Data

US 2002/0191721 A1 Dec. 19, 2002

Related U.S. Application Data

(63) Continuation of application No. PCT/JP00/01134, filed on Feb. 25, 2000.

(51) Int. Cl.⁷ ................................................. H04L 7/00
(52) U.S. Cl. ........................................ 375/354; 375/259
(58) Field of Search ................................ 375/259, 354, 375/356, 365, 366–368, 316, 295; 370/503, 509, 510–515

(56) References Cited

U.S. PATENT DOCUMENTS

| | | | |
|---|---|---|---|
| 3,854,011 A | * | 12/1974 | Mallory et al. ............. 370/510 |
| 5,321,727 A | | 6/1994 | Bonnet et al. |
| 6,577,647 B1 | * | 6/2003 | Unno ........................ 370/503 |

FOREIGN PATENT DOCUMENTS

| | | |
|---|---|---|
| EP | 4-54246 | 4/1991 |
| JP | 63-244949 | 10/1988 |
| JP | 63-245033 | 10/1988 |
| JP | 2-192240 | 7/1990 |
| JP | 4-114527 | 4/1992 |
| JP | 4-229736 | 8/1992 |
| JP | 6-125323 | 5/1994 |

\* cited by examiner

*Primary Examiner*—Tesfaldet Bocure
(74) *Attorney, Agent, or Firm*—Katten Muchin Zavis Rosenman

(57) ABSTRACT

A data transmission system efficiently transmits data of high quality by accurately restoring the sequence of the transmitted data at a receiving circuit. The data transmission system includes a periodic data generating unit for generating periodic data, a parallel/serial converting unit for multiplexing parallel transmission data and the periodic data and converting multiplexed data into serial data, a serial data sending unit for sending the serial data, a serial data receiving unit for receiving the serial data, a serial/parallel converting unit for converting the serial data into parallel data, a periodic data string detecting unit for detecting a periodic data string from strings of the parallel data, and a transmission data restoring unit for restoring the transmission data based on the detected periodic data string.

5 Claims, 12 Drawing Sheets

DATA TRANSMISSION SYSTEM

This application is a continuing application, filed under 35 U.S.C. §111(a), of International Application PCT/JP00/01134, filed Feb. 25, 2000.

BACKGROUND OF THE INVENTION

1. Field of the Invention

The present invention relates to a data transmission system, and more particularly to a data transmission system for performing digital transmission of data.

2. Description of the Related Art

As LSI chips become larger in capacity, more highly integrated, and faster in operation, the amount of information handled by a single LSI chip is enormous and the amount of data inputted to and outputted from the LSI chip is also large. In order to transfer signals through a limited number of terminals on LSI chips to input and output the increased amount of data, it is necessary to provide efficient interfacing between LSI chips.

For efficiently transmitting and receiving data between LSI chips, it is the customary practice for the transmitting circuit to convert the data from parallel format to serial format for transmission over a reduced number of signal lines and for the receiving circuit to convert the received serial data back to the parallel data for reproduction of the data.

For example, data of 622.08 Mbps is processed at 77.76 Mbps×8 in an LSI chip, converted from parallel format to serial format at a ratio of 8:1 for being outputted from the LSI chip, and transmitted at 622.08 Mbps. The receiving circuit converts the received data from serial format to parallel format, obtaining the original parallel data.

The above conventional process of transmitting data between LSI chips is disadvantageous in that it occasionally happens for the bit sequence that is transmitted from the transmitting circuit to fail to be restored with accuracy.

FIGS. 11 and 12 of the accompanying drawings are illustrative of the above problem of the conventional process of transmitting data between LSI chips. A sending LSI chip 100 has a parallel/serial converter 101, and a receiving LSI chip 200 has a serial/parallel converter 201. One-bit data transmission is performed between the parallel/serial converter 101 and the serial/parallel converter 201.

The parallel/serial converter 101 has input terminals Pi1 through Pi8 supplied with respective parallel transmission data D1 through D8 of 77.76 Mbps. The parallel/serial converter 101 converts the transmission data D1 through D8 into serial data of 622.08 Mbps and outputs the serial data.

The serial/parallel converter 201 receives the serial data transmitted from the sending LSI chip 100, and converts the received serial data into parallel data and outputs data of 77.76 Mbps×8 from respective output terminals Po1 through Po8 thereof.

As shown in FIG. 11, the data D1 through D8 supplied to the respective input terminals Pi1 through Pi8 of the parallel/serial converter 101 should be outputted from the respective output terminals Po1 through Po8 of the serial/parallel converter 201.

However, as shown in FIG. 12, the data D4 to be outputted from the output terminal Po4 is outputted from the output terminal Po1, and the data D5 through D8, D1 through D3 are outputted respectively from the output terminals Po2 through Po8. The bit sequence is thus not restored with accuracy at the receiving LSI chip unless there is information indicative of a break in the serial data.

If the amount of data to be transmitted is too large, then since it cannot be transmitted over a single serial signal line, a plurality of signal lines are used to transmit serial data parallel to each other. This transmission scheme suffers, in addition to the above drawback, a problem in that because the serial data transmitted parallel to each other are subject to different propagation delays, the bit sequence of the parallel data reproduced at the receiving LSI chip tends to undergo a phase shift.

SUMMARY OF THE INVENTION

It is therefore an object of the present invention to provide a data transmission system for efficiently transmitting data of high quality by accurately restoring the sequence of the transmitted data at a receiving circuit.

To achieve the above object, there is provided in accordance with the present invention a data transmission system for performing digital transmission of data. The data transmission system has a data sending device including periodic data generating means for generating periodic data, parallel/serial converting means for multiplexing parallel transmission data and the periodic data and converting multiplexed data into serial data, and serial data sending means for sending the serial data; and a data receiving device including serial data receiving means for receiving the serial data, serial/parallel converting means for converting the serial data into parallel data, periodic data string detecting means for detecting a periodic data string from strings of the parallel data, and transmission data restoring means for restoring the transmission data based on the detected periodic data string.

The above and other objects, features, and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
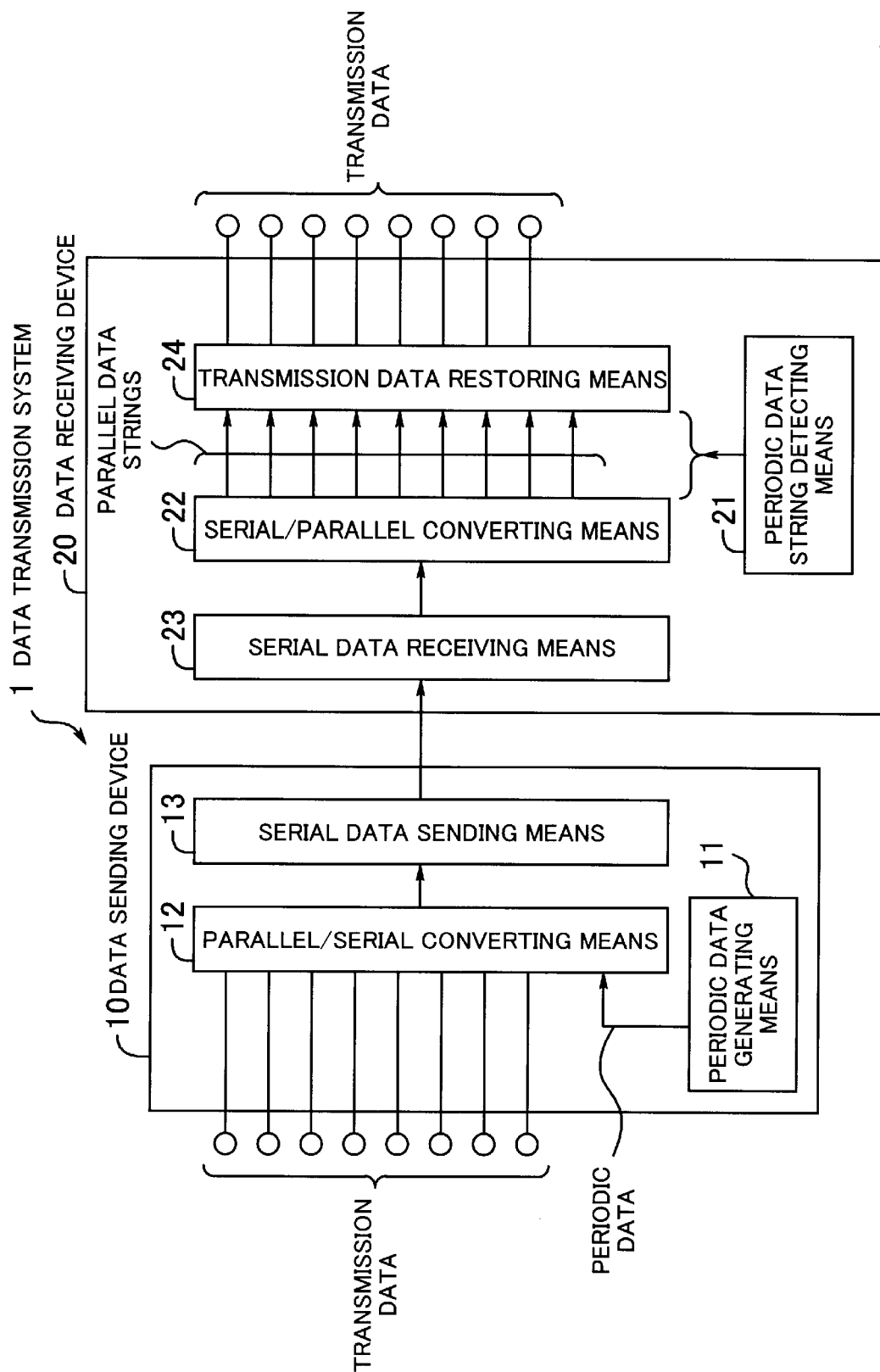
FIG. 1 is a block diagram showing the principles of a data transmission system according to an embodiment of the present invention.

FIG. 1 shows in block form the principles of a data transmission system according to an embodiment of the present invention. As shown in FIG. 1, the data transmission system, generally designated by 1, comprises a data sending device 10 and a data receiving device 20 for digitally transmitting data therebetween.

Each of the data sending device 10 and the data receiving device 20 is actually in the form of an ASIC (Application Specific Integrated Circuit) mounted on a single integrated circuit.

The data sending device 10 has a periodic data generating means 11 for generating periodic data such as a PN (Pseudo-Noise) code, for example.

The data sending device 10 also has a parallel/serial converting means 12 for multiplexing parallel transmission data and periodic data and converting the multiplexed data into serial data, and a serial data sending means 13 for sending the serial data from the parallel/serial converting means 12 to the data receiving device 20.

The data receiving device 20 has a serial data receiving means 23 for receiving serial data sent from the data sending device 10, and a serial/parallel converting means 22 for converting the serial data from the serial data receiving means 23 into parallel data.

The data receiving device 20 also has a periodic data string detecting means 21 for detecting a periodic data string from strings of the parallel data outputted from the serial/parallel converting means 22. Specifically, the strings of the parallel data outputted from the serial/parallel converting means 22 include at least one periodic data string which outputs periodic data.

The strings of the parallel data may possibly contain, by chance, a data string identical to a periodic data string. Therefore, the strings of the parallel data are checked until they are reliably narrowed down to a single data string, so that a true periodic data string can be detected among the strings of the parallel data. The periodic data string detecting means 21 indicates, to a transmission data restoring means 24, which one of the strings of the parallel data is a periodic data string.

The transmission data restoring means 24 restores the transmission data based on the detected periodic data string.

Figure 2:
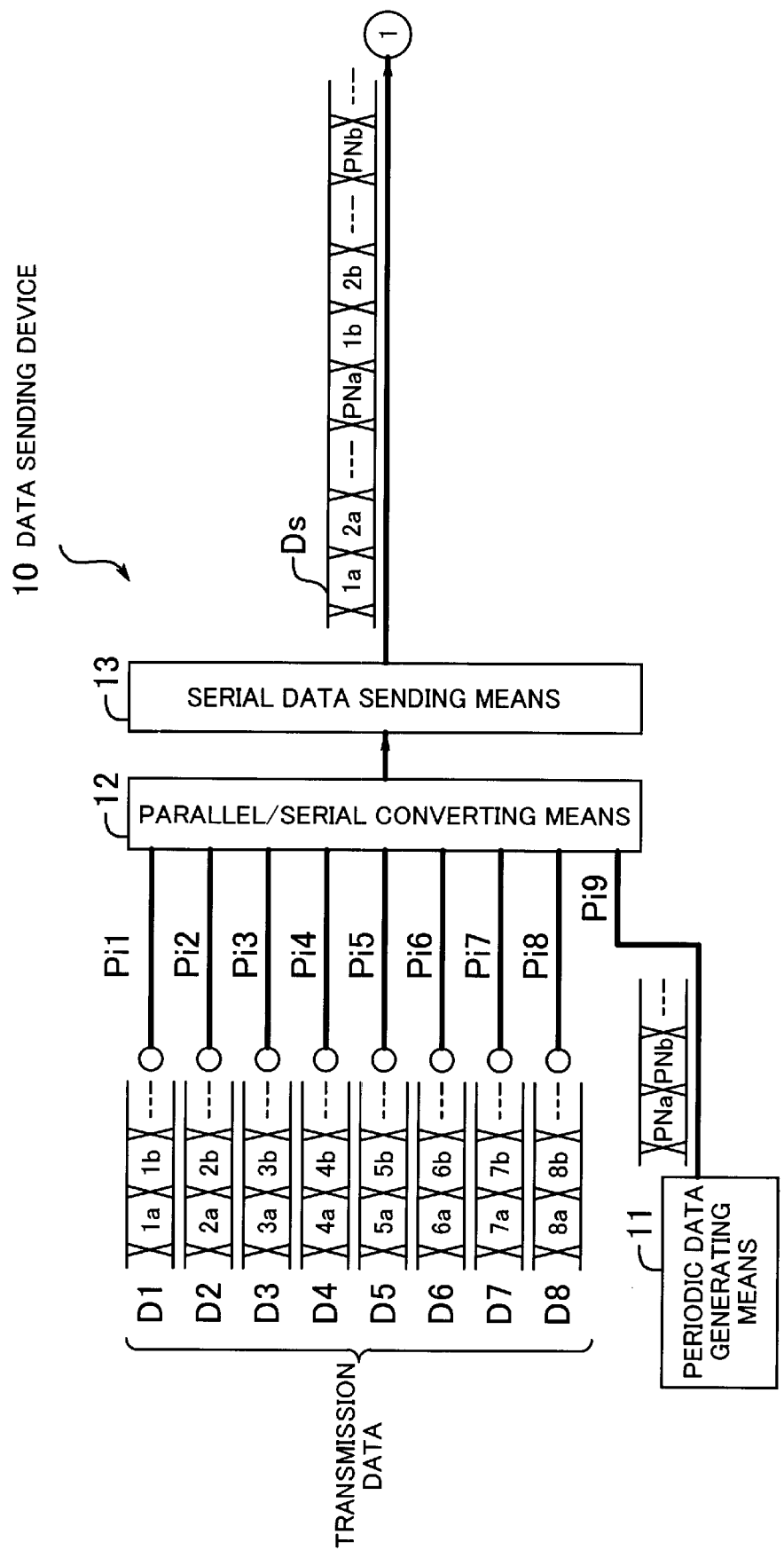
FIG. 2 is a diagram illustrative of the manner in which a data sending device of the data transmission system operates.
Figure 3:
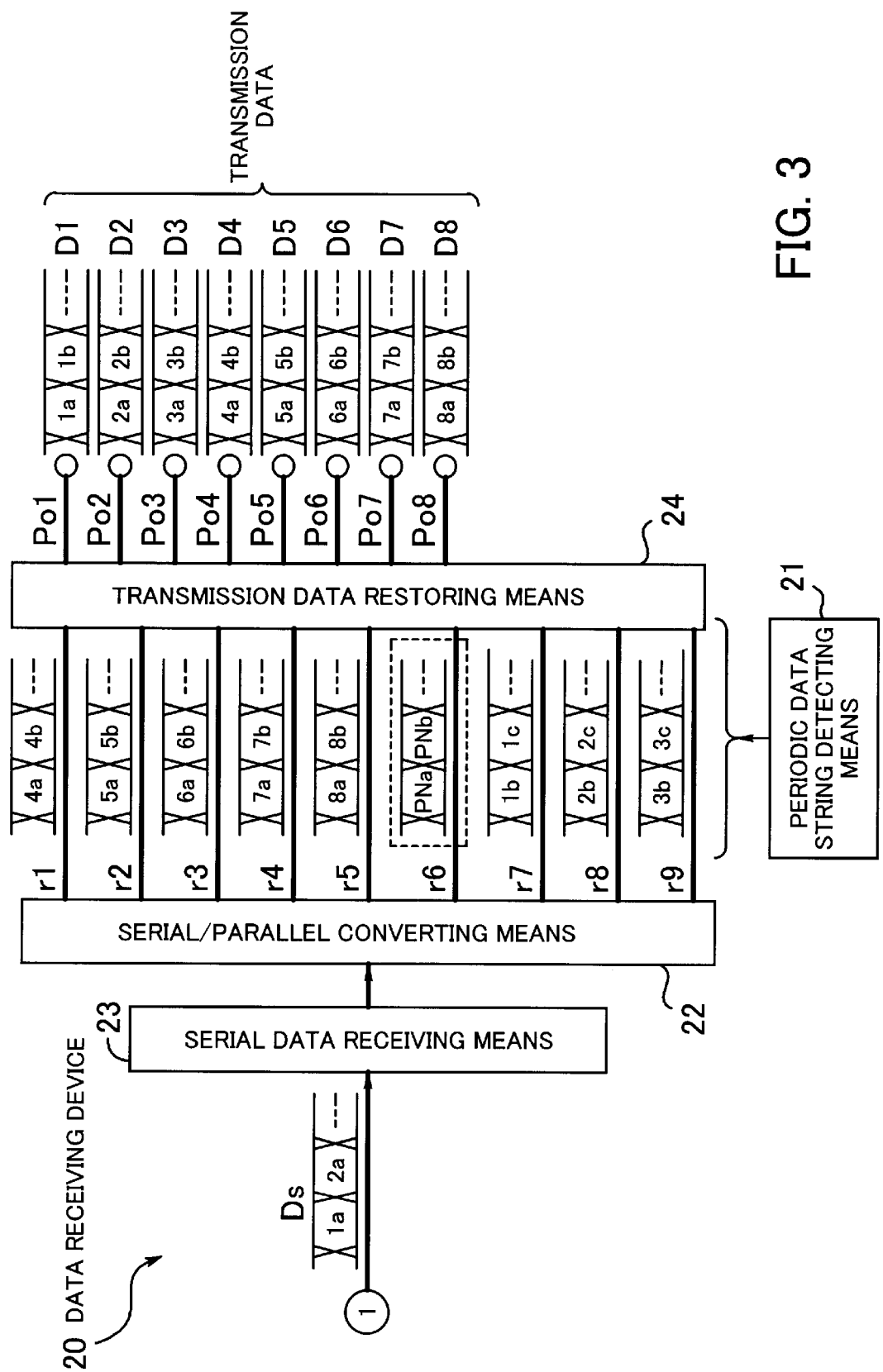
FIG. 3 is a diagram illustrative of the manner in which a data receiving device of the data transmission system operates.

Operation of the data transmission system 1 will be described in detail below. FIG. 2 is illustrative of the manner in which the data sending device 10 operates, and FIG. 3 is illustrative of the manner in which the data receiving device 20 operates.

As shown in FIG. 2, the periodic data generating means 11 of the data sending device 10 generates a PN code as periodic data. The input terminals Pi1 through Pi8 of the parallel/serial converting means 12 are supplied with respective parallel transmission data D1 through D8. The parallel/serial converting means 12 multiplexes the transmission data D1 through D8 and the PN code, converts the multiplexed data into serial data, and outputs the serial data to the serial data sending means 13.

In FG. 2, the parallel/serial converting means 12 multiplexes the data D1 through D8 and the PN code such that a PNa bit of the PN code is added as a ninth bit to 8 bits 1a through 8a of the transmission data D1 through D8, a PNb bit of the PN code is added as a ninth bit to 8 bits 1b through 8b of the transmission data D1 through D8, and so forth.

The serial data sending means 13 sends the multiplexed serial data Ds to the data receiving device 20. Therefore, the data sending device 10 transmits the data at a parallel/serial ratio of 9:1.

As shown in FIG. 3, the serial data receiving means 23 of the data receiving device 20 receives the serial data Ds sent from the data sending device 10. The serial/parallel converting means 22 converts the serial data Ds into parallel data. Specifically, the serial/parallel converting means 22 converts the serial data Ds into parallel data at a serial/parallel ratio of 1:9, and outputs the parallel data as nine parallel data strings r1 through r9.

The periodic data string detecting means 21 monitors the nine parallel data strings r1 through r9 at all times, and detects a periodic data string which outputs periodic data from the parallel data strings r1 through r9.

In FIG. 3, the transmission data D4 through D8 are outputted respectively as the parallel data strings r1 through r5, the PN code as the parallel data string r6, and the transmission data D1 through D3 respectively as the parallel data strings r7 through r9. Therefore, the periodic data string detecting means 21 detects the parallel data string r6 as the periodic data string r6, and indicates, to the transmission data restoring means 24, that the periodic data string is the parallel data string r6.

The transmission data restoring means 24 recognizes a string immediately after the detected periodic data string as the head of the transmission data. This is because the data sending device 10 has added the periodic data to the ninth bits of the 8-bit parallel transmission data D1 through D8 and converted the multiplexed data into the serial data Ds. The transmission data restoring means 24 recognizes the parallel data string r7 immediately after the periodic data string r6 as the transmission data D1.

Since the transmission data restoring means 24 recognizes the parallel data string r7 as the transmission data D1, it can recognize the remaining parallel data strings r8, r9, r1 through r5 as the transmission data D2, D3, D4 through D8, respectively. The transmission data restoring means 24 outputs the transmission data D1 through D8 successively from the output terminals Po1 through Po8, thus restoring the sequence of the transmission data accurately.

Figure 4:
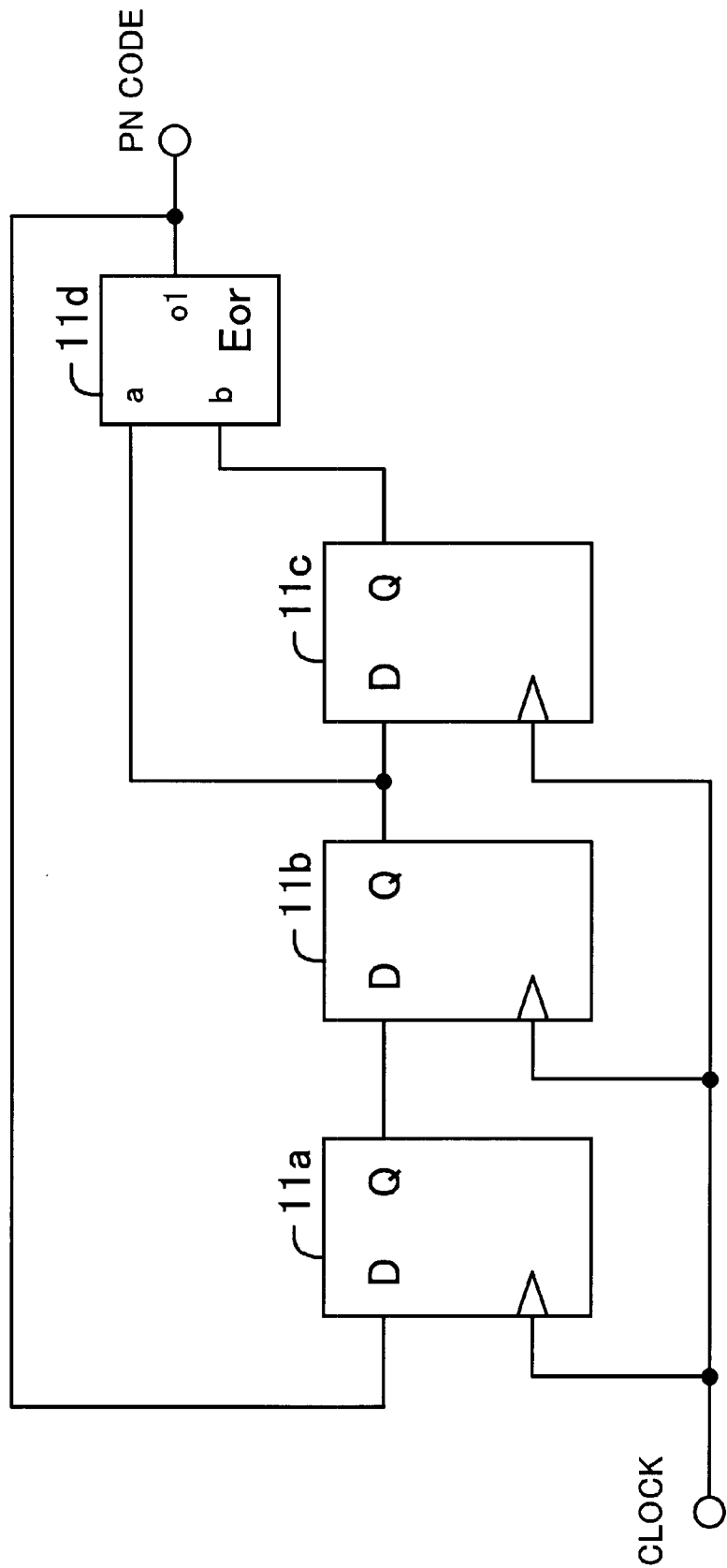
FIG. 4 is a block diagram of a circuit arrangement of a periodic data generating means of the data transmission system.

A circuit arrangement of the periodic data generating means 11 will be described below. FIG. 4 shows a circuit arrangement of the periodic data generating means 11. In FIG. 4, the periodic data generating means 11 comprises a circuit for outputting a PN code having a bit length of $2^3-1$ according to a generating polynomial $X^3+X^2+1$.

Specifically, the periodic data generating means 11 comprises D-type flip-flops 11a, 11b, 11c having respective clock terminals for being supplied with a clock signal. The D-type flip-flop 11a has a D terminal connected to an output terminal o1 of an EOR (Exclusive-OR) gate 11d which outputs the PN code.

The D-type flip-flop 11a has a Q terminal connected to the D terminal of the D-type flip-flop 11b. The D-type flip-flop 11b has a Q terminal connected to the D terminal of the D-type flip-flop 11c and an input terminal a of the EOR gate 11d. The D-type flip-flop 11c has a Q terminal connected to an input terminal b of the EOR gate 11d.

Figure 5:
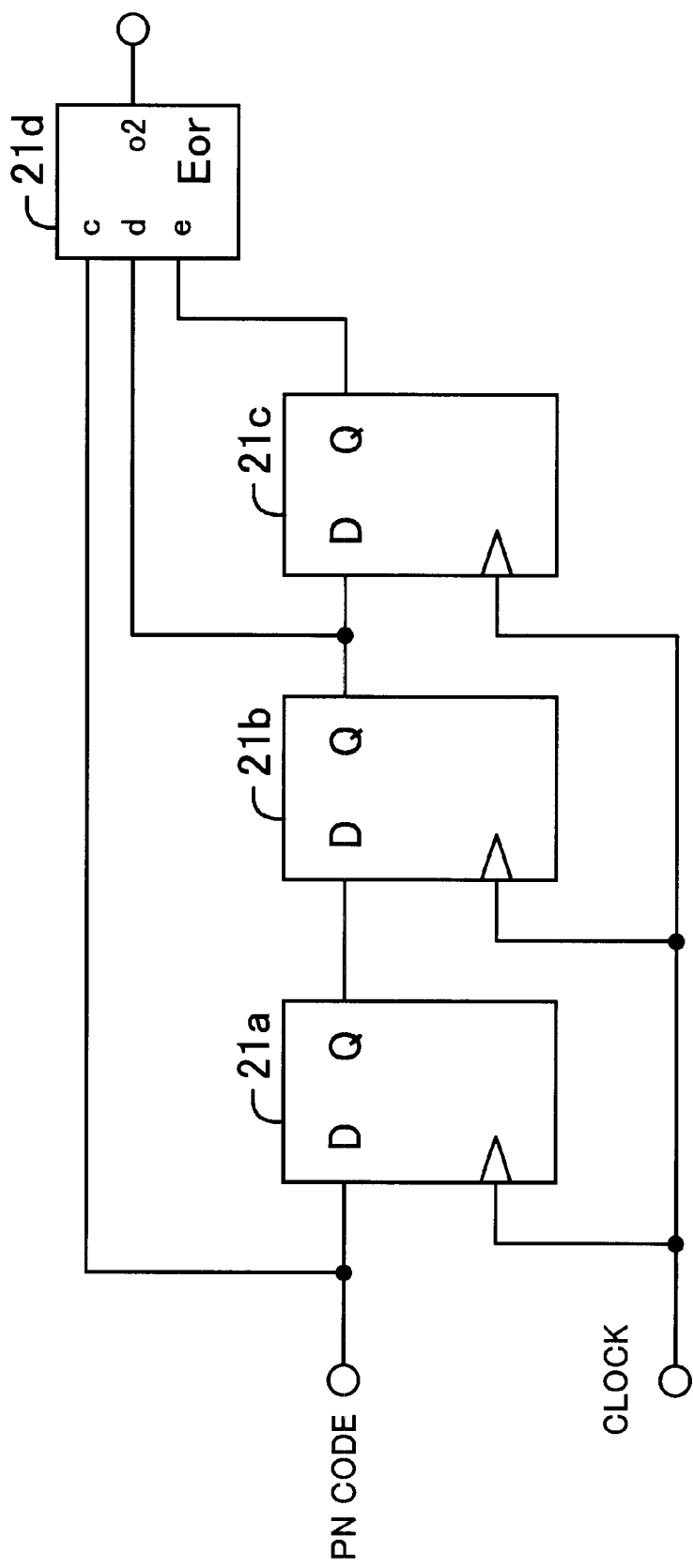
FIG. 5 is a block diagram of a circuit arrangement of a periodic data string detecting means of the data transmission system.

A circuit arrangement of the periodic data string detecting means 21 will be described below. FIG. 5 shows a circuit arrangement of the periodic data string detecting means 21. In FIG. 5, the periodic data string detecting means 21 comprises a circuit for outputting a PN code having a bit length of $2^3-1$ according to a generating polynomial $X^3+X^2+1$.

Specifically, the periodic data string detecting means 21 comprises D-type flip-flops 21a, 21b, 21c having respective clock terminals which are supplied with a clock signal. The D-type flip-flop 21a has a D terminal which is supplied with the PN code. An EOR gate 21d has an input terminal c which is also supplied with the PN code.

The D-type flip-flop 21a has a Q terminal connected to the D terminal of the D-type flip-flop 21b. The D-type flip-flop 21b has a Q terminal connected to the D terminal of the D-type flip-flop 21c and an input terminal d of the EOR gate 21d. The D-type flip-flop 21c has a Q terminal connected to an input terminal e of the EOR gate 21d.

While the periodic data string detecting means 21 is receiving the PN code normally, the output terminal o2 of the EOR gate 21d outputs a signal "H", i.e., the levels of signals supplied to the input terminals c, d, e are different from each other. While the periodic data string detecting means 21 is not receiving the PN code normally, the output terminal o2 of the EOR gate 21d outputs a signal "L".

Figure 6:
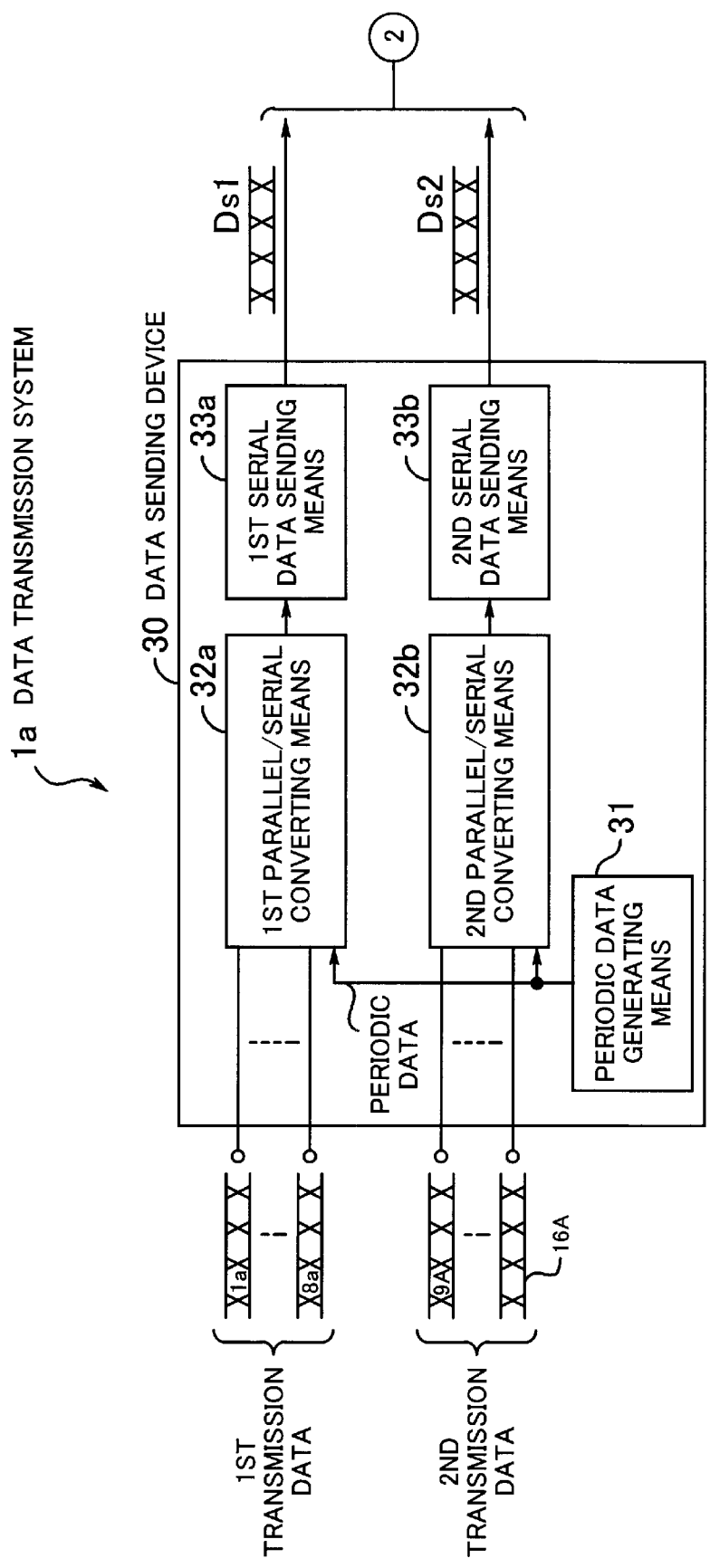
FIGS. 6 and 7 are block diagrams showing the principles of a data transmission system according to another embodiment of the present invention.
Figure 7:
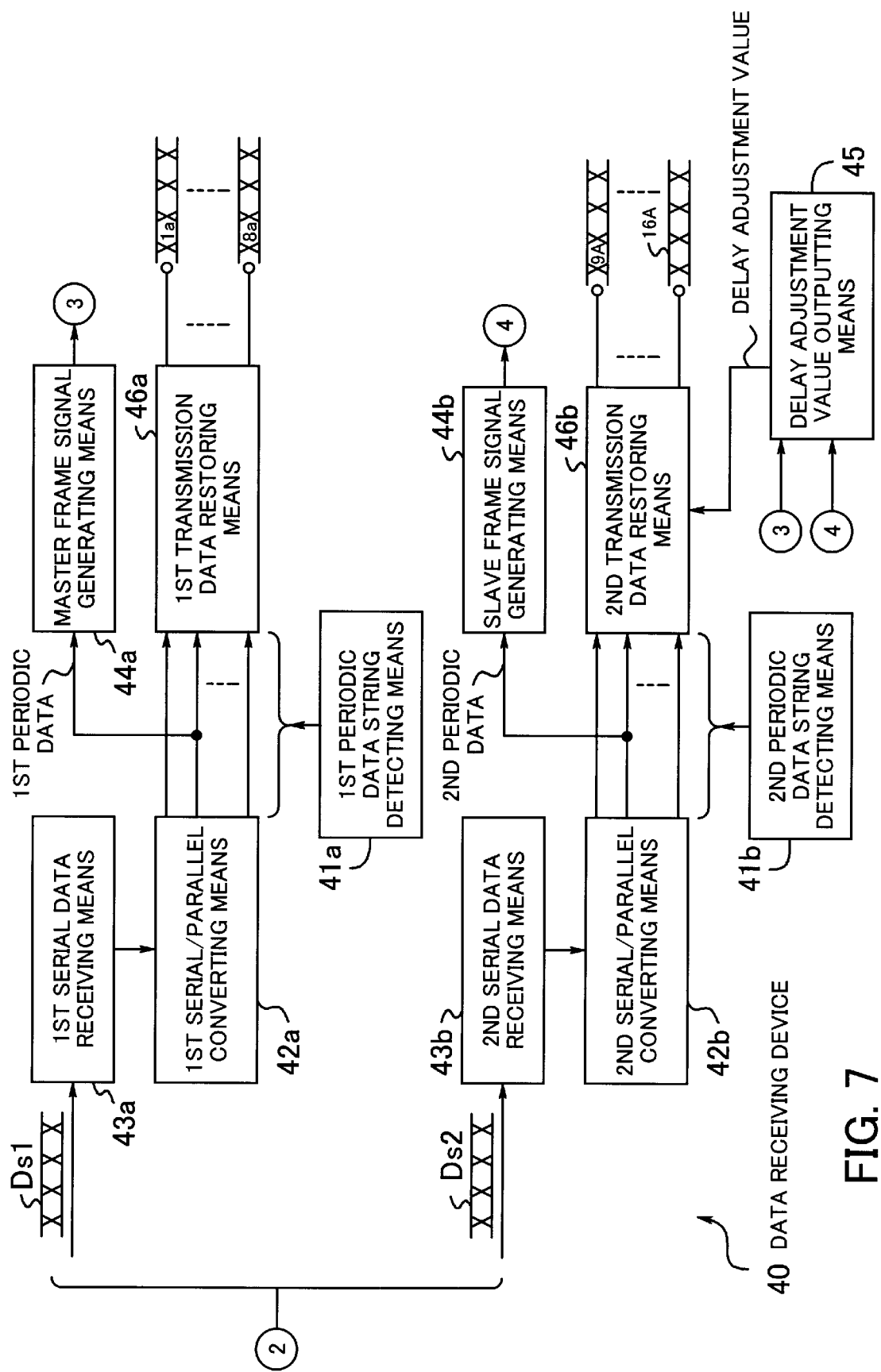

A data transmission system according to another embodiment of the present invention will be described below. FIGS. 6 and 7 show the principles of a data transmission system 1a according to another embodiment of the present invention. As shown in FIGS. 6 and 7, the data transmission system 1a comprises a data sending device 30 and a data receiving device 40 for digitally transmitting data therebetween.

The data transmission system 1a has a function to adjust the phase between a plurality of serial data, in addition to the function of the data transmission system 1 described above. Each of the data sending device 30 and the data receiving device 40 is actually in the form of an ASIC mounted on a single integrated circuit.

The data sending device 30 has a periodic data generating means 31 for generating periodic data such as a PN code, for example.

The data sending device 30 also has a first parallel/serial converting means 32a for multiplexing parallel first transmission data and periodic data and converting the multiplexed data into first serial data Ds1, and a second parallel/serial converting means 32b for multiplexing parallel second transmission data and periodic data and converting the multiplexed data into second serial data Ds2.

The data sending device 30 also has a first serial data sending means 33a for sending the first serial data Ds1 from the first parallel/serial converting means 32a to the data receiving device 40, and a second serial data sending means 33b for sending the second serial data Ds2 from the second parallel/serial converting means 32b to the data receiving device 40.

If the amount of data to be transmitted is too large, then it cannot be transmitted over a single serial signal line as is the case with the above data transmission system 1 shown in FIG. 1. The data transmission system 1a uses a plurality of signal lines to transmit serial data parallel to each other.

Each string of the first transmission data and the second transmission data is significant as one data. For example, in FIG. 6, the first transmission data comprises 8 bits 1a through 8a and the second transmission data comprises 8 bits 9A through 16A, and they are sent as 16-bit parallel transmission data.

The data receiving device 40 has a first serial data receiving means 43a for receiving the first serial data Ds1 from the first serial data sending means 33a, and a second serial data receiving means 43b for receiving the second serial data Ds2 from the second serial data sending means 33b.

The data receiving device 40 also has a first serial/parallel converting means 42a for converting the first serial data Ds1 into first parallel data, and a second serial/parallel converting means 42b for converting the second serial data Ds2 into second parallel data.

The data receiving device 40 also has a first periodic data string detecting means 41a for detecting a first periodic data string from strings of the first parallel data outputted from the first serial/parallel converting means 42a, and a second periodic data string detecting means 41b for detecting a second periodic data string from strings of the second parallel data outputted from the second serial/parallel converting means 42b.

The data receiving device 40 further includes a master frame signal generating means 44a for generating a master frame signal from first periodic data of the first periodic data string, and a slave frame signal generating means 44b for generating a slave frame signal from second periodic data of the second periodic data string. A process of generating the master frame signal and the slave frame signal will be described later on with reference to FIG. 9.

The data receiving device 40 further includes a delay adjustment value outputting means 45 for detecting a phase difference between the master frame signal and the slave frame signal and outputting the detected phase difference as a delay adjustment value.

The data receiving device 40 also includes a first transmission data restoring means 46a for restoring the first transmission data based on the first periodic data string detected by the first periodic data string detecting means 41a, and a second transmission data restoring means 46b for restoring the second transmission data based on the second periodic data string detected by the second periodic data string detecting means 41b and the delay adjustment value outputted from the delay adjustment value outputting means 45.

Even if there is a delay difference between the serial data Ds1, Ds2, the delay difference can be adjusted based on the frame signals generated from the first and second periodic data strings to adjust a phase shift between the plural serial data, thus restoring the sequence of the transmission data accurately.

The bit sequence of the parallel data restored in the data receiving device may become different from the bit sequence of the parallel data in the data sending device due to a difference between the propagation delays of the serial data. Such a bit sequence difference will be described below.

Figure 8:
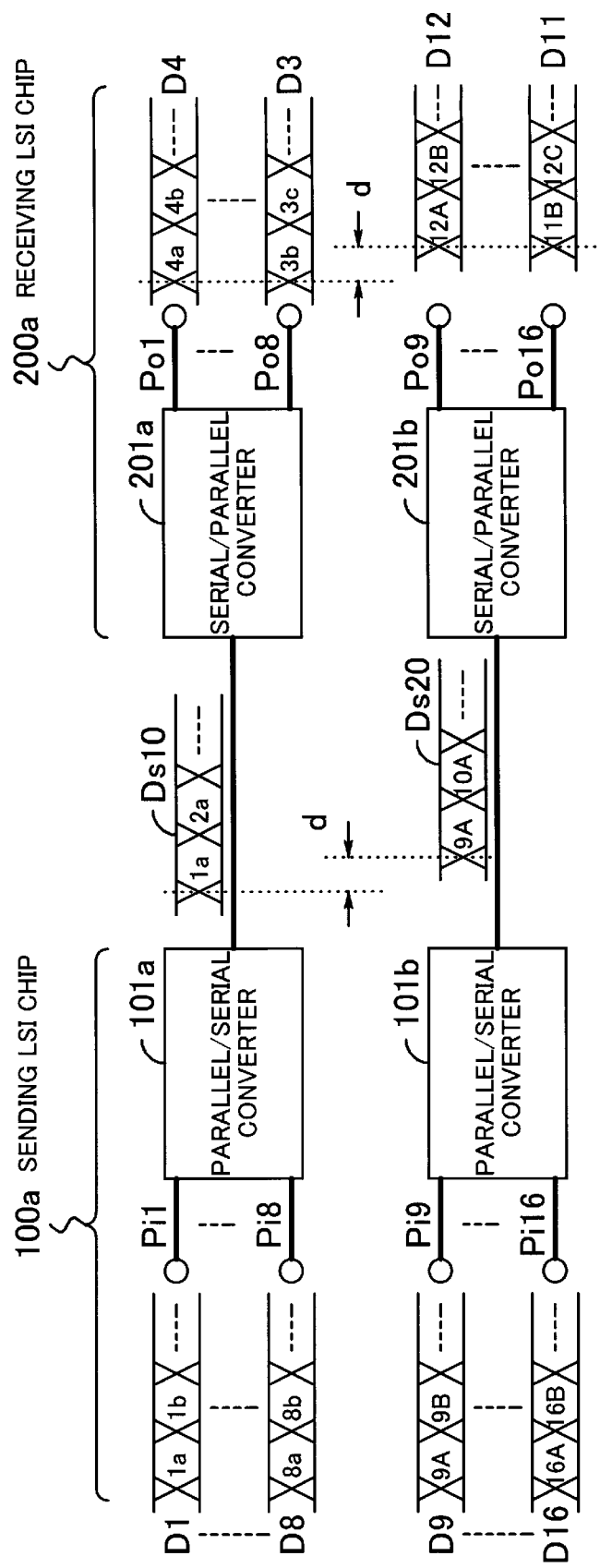
FIG. 8 is a diagram illustrating a problem of a conventional process of transmitting data between LSI chips.

FIG. 8 illustrates a problem of a conventional process of transmitting data between LSI chips. As shown in FIG. 8, a sending LSI chip 100a has a pair of parallel/serial converters 101a, 101b and a receiving LSI chip 200a has a pair of serial/parallel converters 201a, 201b.

Serial data is transmitted between the parallel/serial converter 110a and the serial/parallel converter 201a, and serial data is transmitted between the parallel/serial converter 101b and the serial/parallel converter 201b.

The sending LSI chip 100a divides 16-bit parallel data into two sets of 8-bit parallel data, converts the two sets of 8-bit parallel data into respective sets of serial data, and sends the two sets of serial data Ds10, Ds20 to the receiving LSI chip 200a. The receiving LSI chip 200a receives the two sets of serial data Ds10, Ds20, converts the two sets of serial data Ds10, Ds20 into respective sets of parallel data, and generate 16-bit parallel data from the sets of parallel data.

The parallel/serial converter 110a has input terminals Pi1 through Pi8 supplied with parallel data D1 through D8. The parallel/serial converter 101a converts the parallel data D1 through D8 into serial data Ds10 and outputs the serial data Ds10.

The parallel/serial converter 101b has input terminals Pi9 through Pi16 supplied with parallel data D9 through D16. The parallel/serial converter 101b converts the parallel data D9 through D16 into serial data Ds20 and outputs the serial data Ds20.

The serial/parallel converter 201a receives the serial data Ds10 sent from the parallel/serial converter 101a, converts the serial data Ds10 into parallel data, and outputs the parallel data from respective output terminals Po1 through Po8.

The serial/parallel converter 201b receives the serial data Ds20 sent from the parallel/serial converter 101b, converts the serial data Ds20 into parallel data, and outputs the parallel data from respective output terminals Po9 through Po16.

Figure 11:
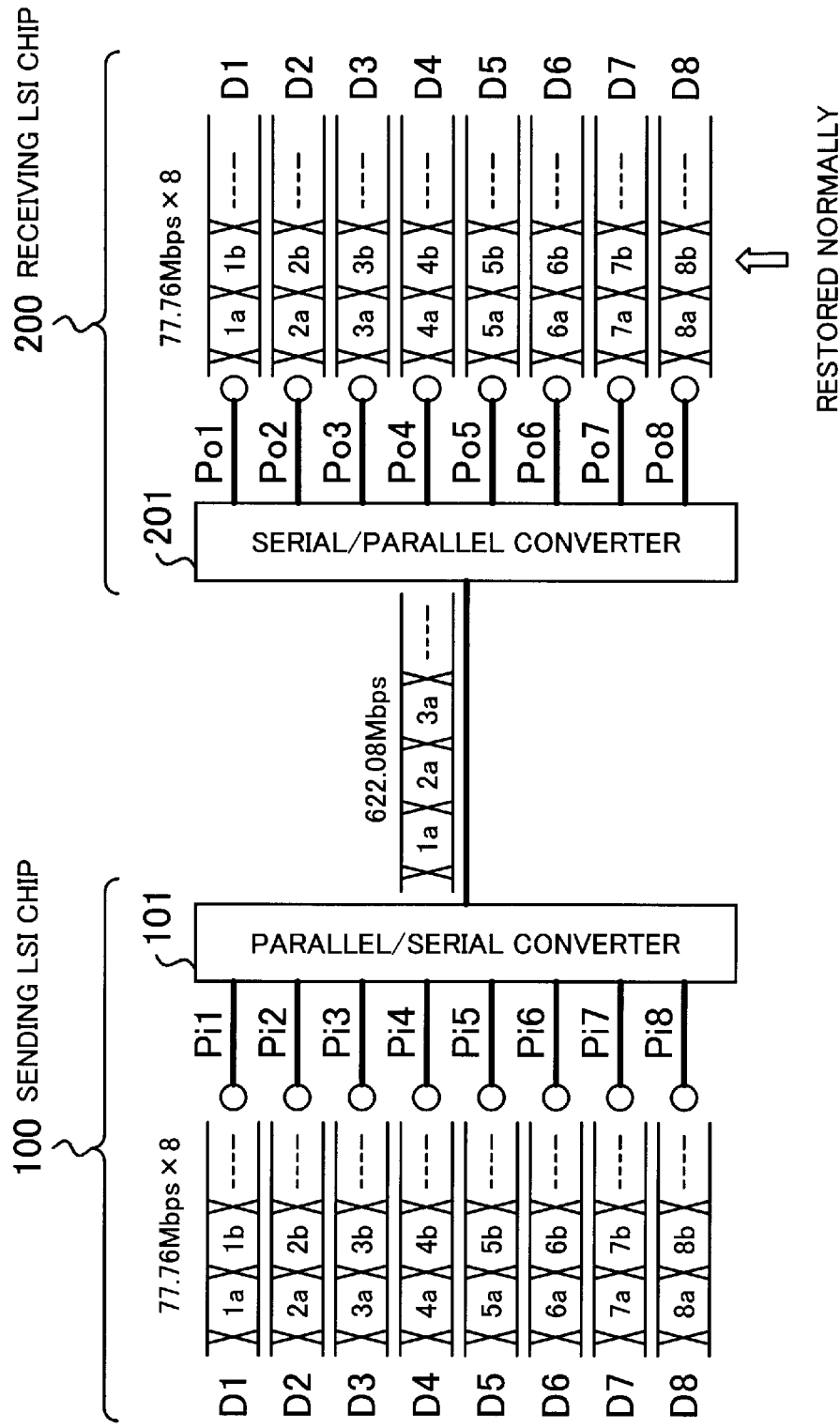
FIGS. 11 and 12 are diagrams illustrative of the problem of the conventional process of transmitting data between LSI chips.
Figure 12:
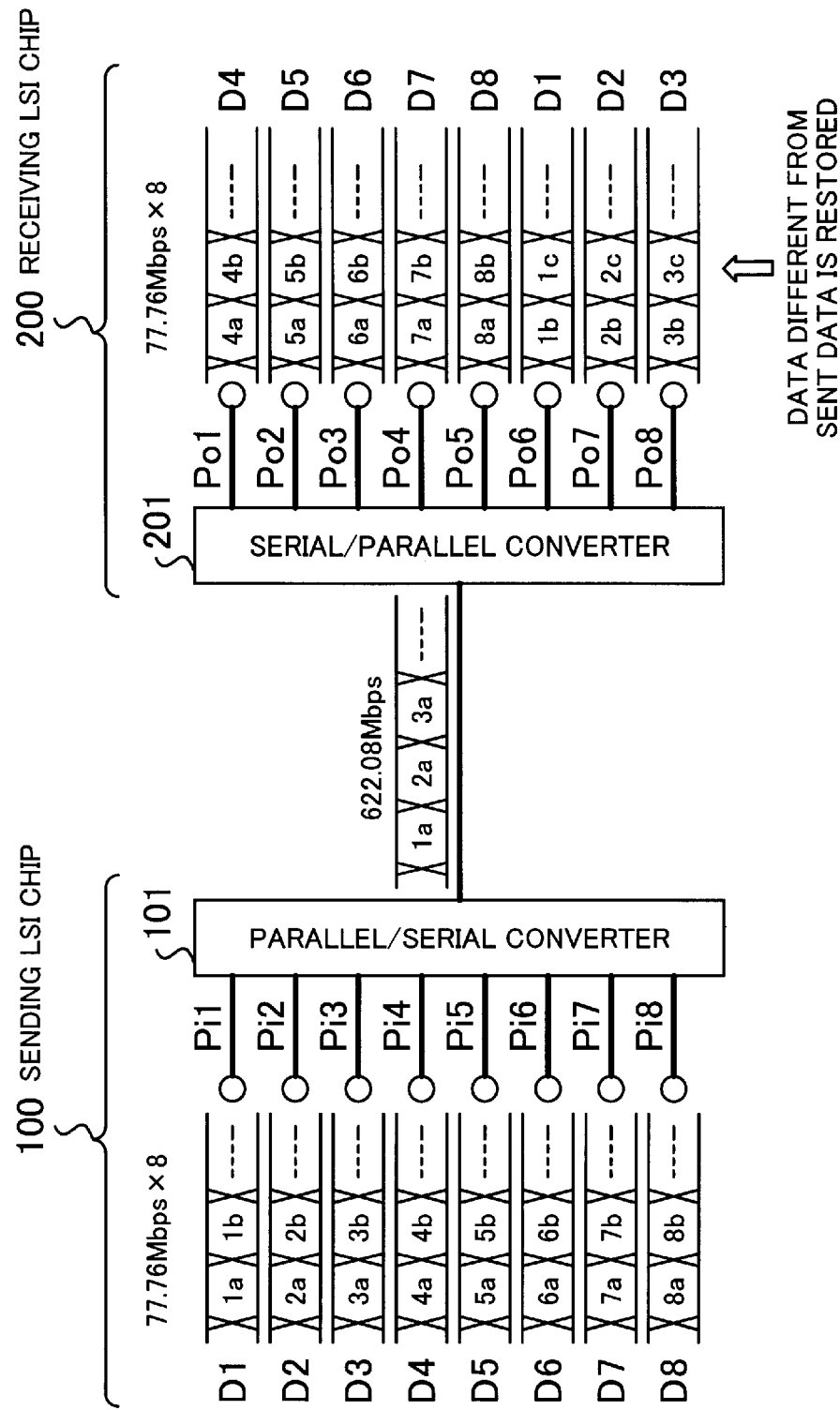

If the data transmission shown in FIG. 8 is viewed in terms of each serial data, then it suffers the problem described above with reference to FIGS. 11 and 12. Specifically, as shown in FIG. 8, the data D4 to be outputted from the output terminal Po4 is outputted from the output terminal Po1, and the data D5 through D8, D1 through D3 are outputted respectively from the output terminals Po2 through Po8.

Furthermore, the data D12 to be outputted from the output terminal Po12 is outputted from the output terminal Po9, and the data D13 through D16, D9 through D11 are outputted respectively from the output terminals Po10 through Po16.

In addition, the transmission paths for the serial data Ds10, Ds20 suffer a phase difference d shown in FIG. 8. Consequently, if the serial data are directly converted into the parallel data in the receiving LSI chip 200a, the above problem described with reference to FIGS. 11 and 12 occurs, and a phase shift is produced between the data D1 through D8 and the data D9 through D16, so that the transmission data cannot be restored with accuracy.

Heretofore, if the serial data are of a low rate, then the sent data and the received data can be synchronized by sending a frame signal indicative of the head of the serial data parallel to the serial data. However, if the serial data are of a high rate, it is difficult to maintain a skew margin between the frame signal and the serial data.

The data transmission system 1a according to the present invention is arranged to restore the transmission data accurately in the receiving circuit while adjusting the phase between the plural serial data.

Figure 9:
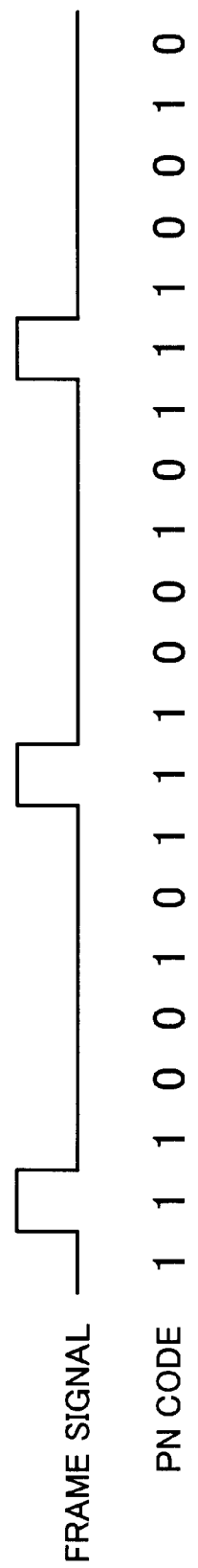
FIG. 9 is a diagram showing the generation of a frame signal.

Each of the frame signals will be described below. FIG. 9 shows the generation of a frame signal. If the PN code generated by the periodic data generating means 31 comprises a code having a bit length of $2^3-1$, then it represents periodic data of repeated bit strings of 1110010.

When the master frame signal generating means 44a and the slave frame signal generating means 44b receive the PN code of 1110010, they generate a pulse in synchronism with the central "1" of each row of three 1s, and outputs the pulse signal as the master frame signal and the slave frame signal.

Figure 10:
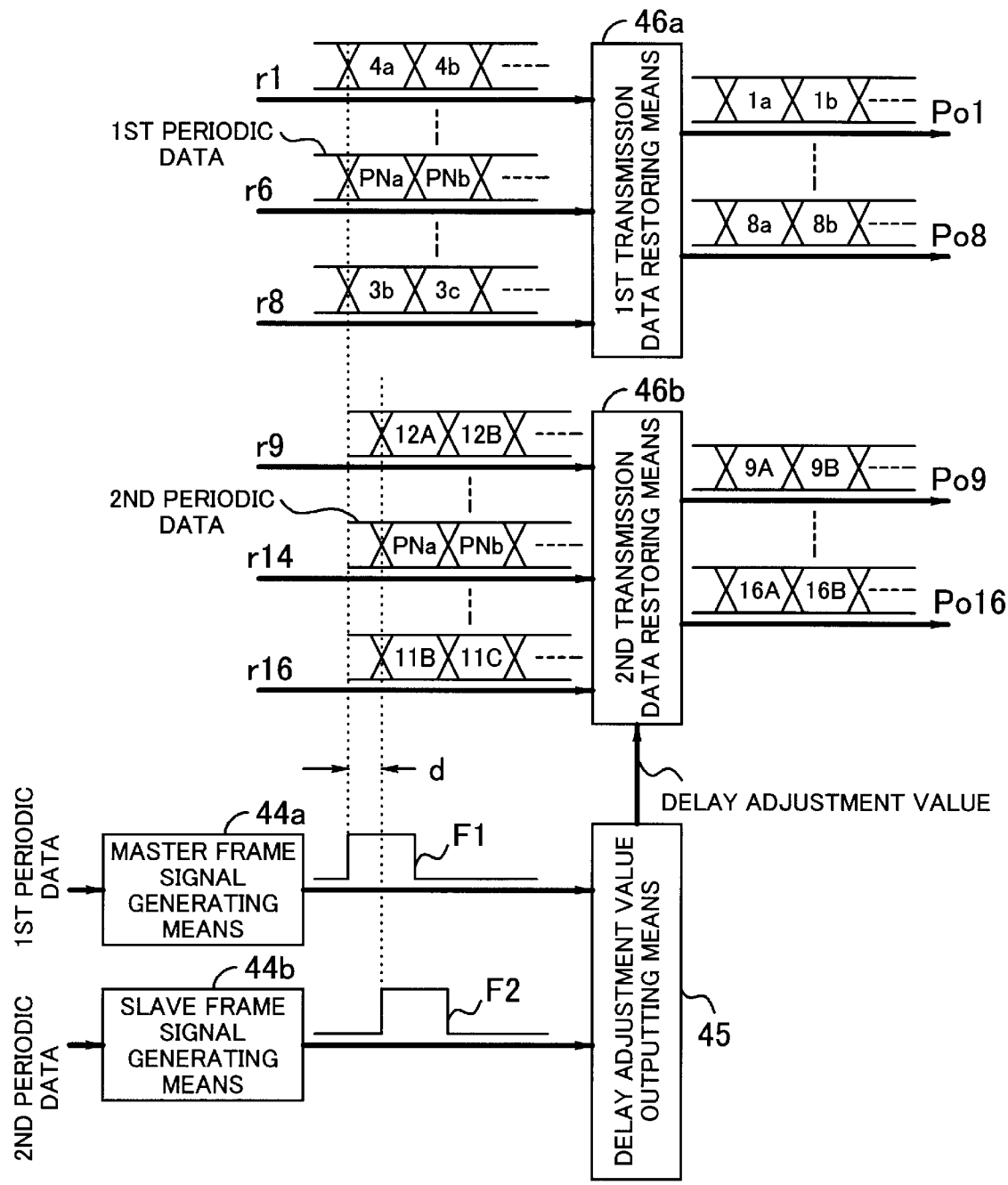
FIG. 10 is a diagram illustrating the manner in which the data transmission system according to the other embodiment of the present invention operates to restore data by adjusting a delay.

A process of restoring the transmission data based on a delay adjustment in the data transmission system 1a will be described below. FIG. 10 illustrates the manner in which the data transmission system 1a operates to restore the transmission data by adjusting a delay.

In FIG. 10, the first and second serial data receiving means 43a, 43b, the first and second serial/parallel converting means 42a, 42b, and the first and second periodic data string detecting means 41a, 41b are omitted from illustration.

The master frame signal generating means 44a receives the first periodic data and generates a master frame signal F1, and the slave frame signal generating means 44b receives the second periodic data and generates a slave frame signal F2.

The delay adjustment value outputting means 45 outputs the phase difference d between the master frame signal F1 and the slave frame signal F2 and outputs the detected phase difference d as a delay adjustment value.

The first transmission data restoring means 46a recognizes a string immediately after the detected first periodic data string as the head of the transmission data. Specifically, the first transmission data restoring means 46a recognizes the parallel data string r7 immediately after the periodic data string r6 as the transmission data D1. The first transmission data restoring means 46a outputs the transmission data D1 through D8 successively from the output terminals Po1 through Po8.

The second transmission data restoring means 46b recognizes a string immediately after the detected second periodic data string as the head of the transmission data. Specifically, the second transmission data restoring means 46b recognizes the parallel data string r15 immediately after the periodic data string r14 as the transmission data D9. The second transmission data restoring means 46b outputs the transmission data D9 through D16 successively from the output terminals Po9 through Po16 so as to be in phase with the transmission data D1 through D8 outputted from the first transmission data restoring means 46a based on the received delay adjustment value d.

As described above, the data transmission system 1a is arranged to perform a function to adjust a delay between a plurality of serial data in addition to the function provided by the data transmission system 1. Therefore, since the sequence of the transmission data can be restored accurately in the receiving circuit, data of high quality can be transmitted efficiently.

In the above other embodiment, 16-bit parallel data has been described as the first and second transmission data. However, the principles of the present invention are not limited to the transmission of 16-bit parallel data, but are also applicable to the transmission of parallel data of any bits.

In the above embodiments, the PN code is used as the periodic data. However, any periodic data other than the PN code may be used.

As described above, the data transmission system according to the present invention converts parallel transmission data and periodic data into serial data, sends the serial data, converts the received serial data into parallel data, and restores the transmission data based on a periodic data string detected from strings of the parallel data. Inasmuch as the sequence of the transmission data can be restored accurately, the data transmission system is capable of transmitting high-quality data efficiently.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A data transmission system for digitally transmitting data, comprising:

a data sending device comprising:

periodic data generating means for generating periodic data;

first parallel/serial converting means for multiplexing parallel first transmission data and said periodic data and convening multiplexed data into first serial data;

second parallel/serial converting means for multiplexing parallel second transmission data and said periodic data and converting multiplexed data into second serial data;

first serial data sending means for sending said first serial data; and second serial data sending means for sending said second serial data; and a data receiving device comprising:

first serial data receiving means for receiving said first serial data;

second serial data receiving means for receiving said second serial data;

first serial/parallel converting means for converting said first serial data into first parallel data;

second serial/parallel converting means for converting said second serial data into second parallel data;

first periodic data string detecting means for detecting a first periodic data string from strings of said first parallel data;

second periodic data string detecting means for detecting a second periodic data string from strings of said second parallel data;

master frame signal generating means for generating a master frame signal from first periodic data of said first periodic data string;

slave frame signal generating means for generating a slave frame signal from second periodic data of said second periodic data string;

a delay adjustment value outputting means for detecting a phase difference between said master frame signal and said slave frame signal, and outputting the detected phase difference as a delay adjustment value;

first transmission data restoring means for restoring said first transmission data based on the detected periodic data string; and second transmission data restoring means for restoring said second transmission data based on the detected second periodic data string and said delay adjustment value.

2. The data transmission system according to claim 1, said periodic data generating means comprises means for generating a PN code as said periodic data.

3. The data transmission system according to claim 1, wherein said data sending device is mourned on an integrated circuit.

4. The data transmission system according to claim 1, wherein said data receiving device is mounted on an integrated circuit.

5. A data receiving device for receiving digital data, comprising:

first serial data receiving means for receiving first serial data;

second serial data receiving means for receiving second serial data;

first serial/parallel converting means for convening said first serial data into first parallel data;

second serial/parallel converting means for converting said second serial data into second parallel data;

first periodic data string detecting means for detecting a first periodic data string from strings of said first parallel data;

second periodic data string detecting means for detecting a second periodic data string from strings of said second parallel data;

master frame signal generating means for generating a master frame signal from first periodic data of said first periodic data string;

slave frame signal generating means for generating a slave frame signal from second periodic data of said second periodic data string;

a delay adjustment value outputting means for detecting a phase difference between said master frame signal and said slave frame signal, and outputting the detected phase difference as a delay adjustment value;

first transmission data restoring means for restoring said first transmission data based on the detected first periodic data string; and second transmission data restoring means far restoring said second transmission data based on the detected second periodic data string and said delay adjustment value.

* * * * *